(12) United States Patent
Honda

(10) Patent No.: US 7,362,587 B2
(45) Date of Patent: Apr. 22, 2008

(54) MULTI-CHIP PACKAGE

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/677,351

(22) Filed: Feb. 21, 2007

(65) Prior Publication Data
US 2007/0195491 A1    Aug. 23, 2007

(30) Foreign Application Priority Data
Feb. 21, 2006    (JP) .............................. 2006-043621

(51) Int. Cl.
*H05K 7/02*    (2006.01)
*H05K 7/06*    (2006.01)
*H05K 7/08*    (2006.01)
*H05K 7/10*    (2006.01)

(52) U.S. Cl. ...................... 361/760; 365/233; 365/200; 257/723

(58) Field of Classification Search ................ 365/233, 365/200, 230
See application file for complete search history.

(56) References Cited

U.S. PATENT DOCUMENTS 5,475,646 A * 12/1995 Ogihara ..................... 365/222
6,873,563 B2 * 3/2005 Suwa et al. ............. 365/230.03
7,017,068 B2    3/2006 McBride et al.
7,149,135 B2 * 12/2006 Okuno ....................... 365/200

FOREIGN PATENT DOCUMENTS

| JP | 6-274241 | 9/1994 |
| JP | 11-31747 | 2/1999 |
| JP | 11-102969 | 4/1999 |
| JP | 2005-135183 | 5/2005 |

* cited by examiner

*Primary Examiner*—Tuan T. Dinh
*Assistant Examiner*—Andargie Aychillhum
(74) *Attorney, Agent, or Firm*—Oblon, Spivak, McClelland, Maier & Neustadt, P.C.

(57) ABSTRACT

A multi-chip package includes a first semiconductor memory controlled by a clock signal and an inverted clock signal, and a second semiconductor memory controlled by the clock signal. The first semiconductor memory and the second semiconductor memory each include a circuit for guaranteeing that a signal delay is suppressed between a peripheral circuit, and a pad to which the clock signal is input, a pad to which the inverted clock signal is input, a pad for outputting a data enable signal and a pad for outputting a data signal. Thus, it is guaranteed that the signal delay is suppressed, and the reliability of the multi-chip package is improved.

20 Claims, 8 Drawing Sheets

MULTI-CHIP PACKAGE

CROSS-REFERENCE TO RELATED APPLICATIONS

This application is based upon and claims the benefit of priority from the prior Japanese Patent Application No. 2006-43621, filed on Feb. 21, 2006, the entire contents of which are incorporated herein by reference.

BACKGROUND OF THE INVENTION

1. Field of the Invention

The present invention relates to a multi-chip package, which is a semiconductor memory device including a plurality of semiconductor memories mounted thereon.

2. Description of the Related Art

Recently, multi-chip packages (hereinafter, referred to as "MCP") including a plurality of semiconductor memories accommodated in one package are used in order to meet the recent requirement for more and more compact electronic devices (see, for example, U.S. Pat. No. 7,149,135). Such a plurality of semiconductor memories accommodated in one package may be of an identical type or of different types. In the latter case, the semiconductor memories are different in the line arrangement and circuit structure due to the difference in the operating environment such as the signals to be input thereto or the like. Such a difference in the line arrangement and circuit structure causes a delay of the input signals or the like, which undesirably lowers the performance of the package.

Japanese Laid-Open Patent Publications Nos. H11-102969, H11-31747, and H06-274241 describe technologies regarding semiconductor circuits, which are proposed to lower the delay in clock signals generated by the difference in load capacitance or the like, although not the technologies regarding MCPs.

BRIEF SUMMARY OF THE INVENTION

According to one embodiment of the present invention, a multi-chip package comprises a substrate; a first terminal to which a clock signal is input; a second terminal to which an inverted clock signal is input; a third terminal for outputting a data enable signal in synchronization with the clock signal or the inverted clock signal; a fourth terminal for outputting a data signal in synchronization with the clock signal or the inverted clock signal; a first semiconductor memory, provided on the substrate, which is controlled by the clock signal and the inverted clock signal, including a first pad to which the clock signal is input, a second pad to which the inverted clock signal is input, a third pad for outputting the data enable signal, a fourth pad for outputting the data signal, a first peripheral circuit, a first circuit provided between the first pad and the first peripheral circuit, a second circuit provided between the second pad and the first peripheral circuit, a third circuit provided between the third pad and the first peripheral circuit, and a fourth circuit provided between the fourth pad and the first peripheral circuit; and a second semiconductor memory, provided on the substrate, which is controlled by the clock signal, including a fifth pad to which the clock signal is input, a sixth pad to which the inverted clock signal is input, a seventh pad for outputting the data enable signal, an eighth pad for outputting the data signal, a second peripheral circuit, a fifth circuit provided between the fifth pad and the second peripheral circuit, a sixth circuit provided between the sixth pad and the second peripheral circuit, a seventh circuit provided between the seventh pad and the second peripheral circuit, and an eighth circuit provided between the eighth pad and the second peripheral circuit.

DETAILED DESCRIPTION OF THE INVENTION

Figure 1:
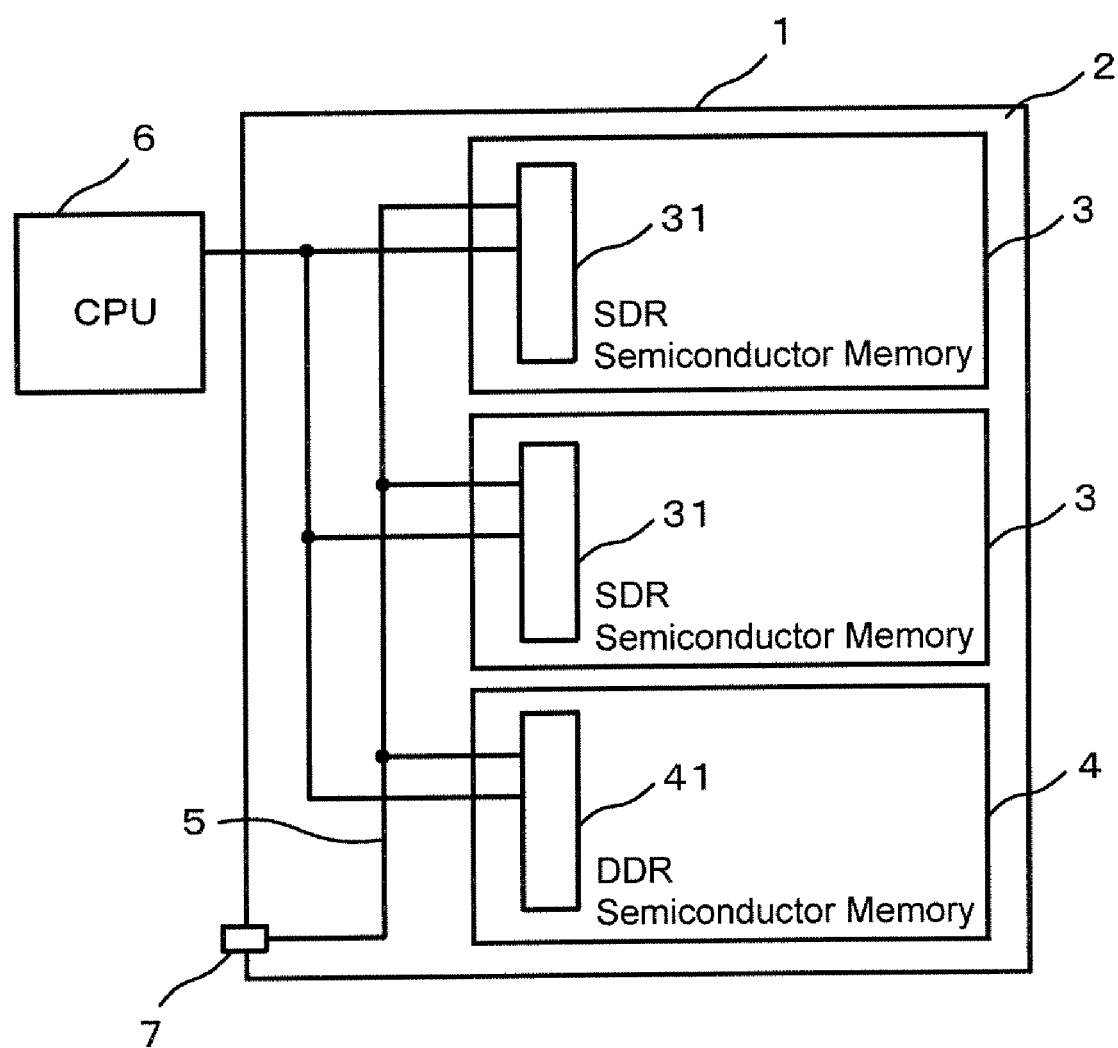
FIG. 1 is a schematic block diagram of a multi-chip package according to one embodiment of the present invention.

Hereinafter, the present invention will be described by way of embodiments with reference to the attached drawings. The present invention may be carried out in many other embodiments and is not limited to the following embodiment in any way. In this specification, identical or like elements bear identical reference numerals and detailed descriptions thereof are not repeated.

FIG. 1 is a schematic block diagram of an MCP 1 according to one embodiment of the present invention. The MCP 1 according to this embodiment includes a substrate 2, an SDR (Single Data Rate) semiconductor memory 3 provided on the substrate 2, and a DDR (Double Data Rate) semiconductor memory 4 also provided on the substrate 2. FIG. 1 shows an example in which the MCP 1 includes two SDR memories 3. Each SDR memory 3 includes a pad section 31, and the DDR semiconductor memory 4 includes a pad section 41. The MCP 1 also includes lines 5 provided on the substrate 2. The lines 5 provided on the substrate 2 connect a terminal 7, for receiving various signals which are input from external devices or outputting various signals to external devices, to the SDR semiconductor memories 3 and the DDR semiconductor memory 4 (in more detail, the pad sections 31 and 41 thereof). The pad sections 31 and 41, for example, transfer various signals to other circuits in the SDR semiconductor memories 3 and the DDR semiconductor memory 4 via the lines 5). The SDR semiconductor memories 3 and the DDR semiconductor memory 4 are each connected to a CPU 6. The CPU 6 executes various types of processing based on data which are stored on the SDR semiconductor memories 3 and the DDR semiconductor memory 4. The CPU 6 may be provided on the substrate 2 or outside the MCP 1.

Figure 2:
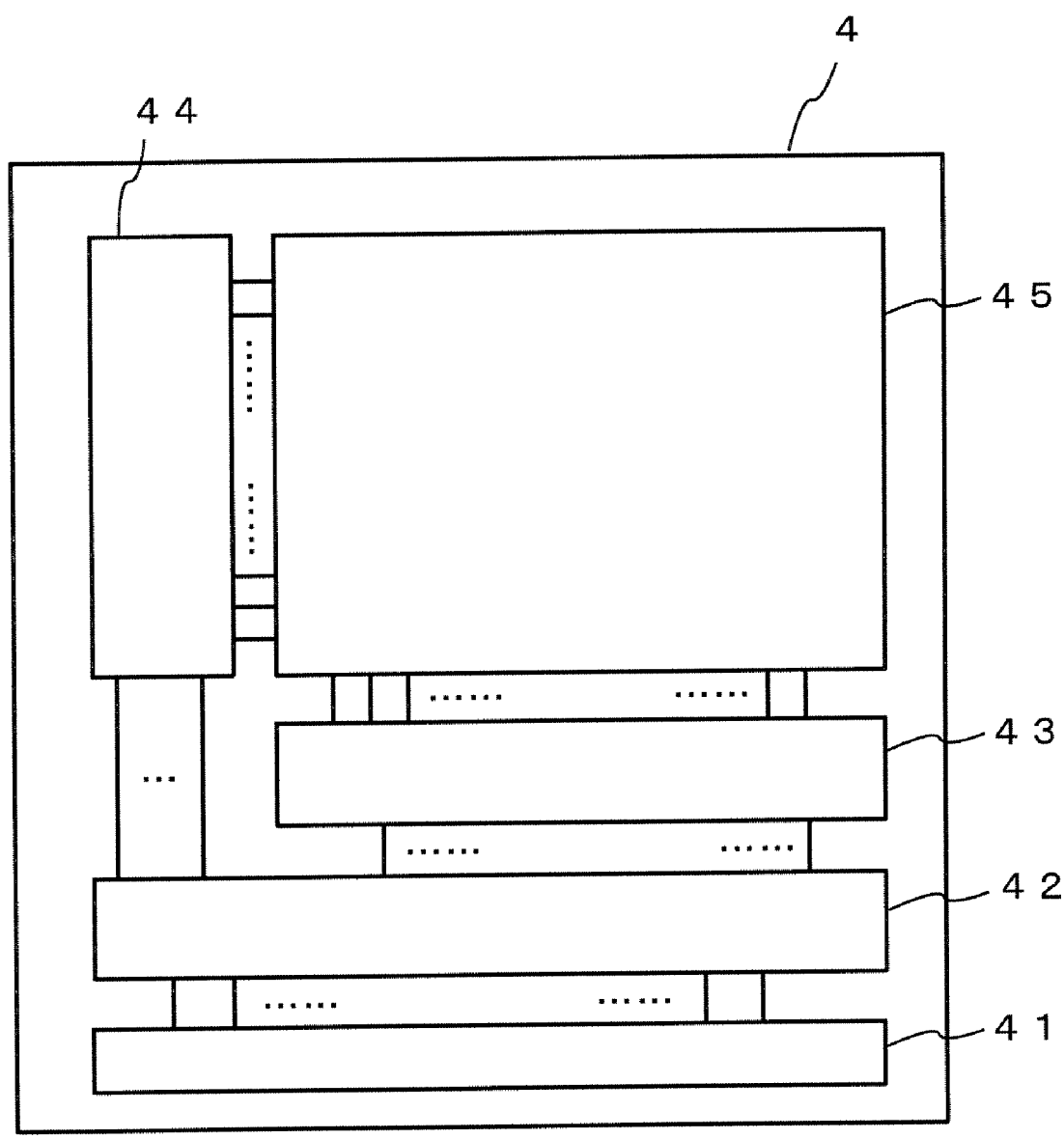
FIG. 2 is a functional block diagram of a DDR semiconductor memory included in the multi-chip package according to one embodiment of the present invention.
Figure 3:
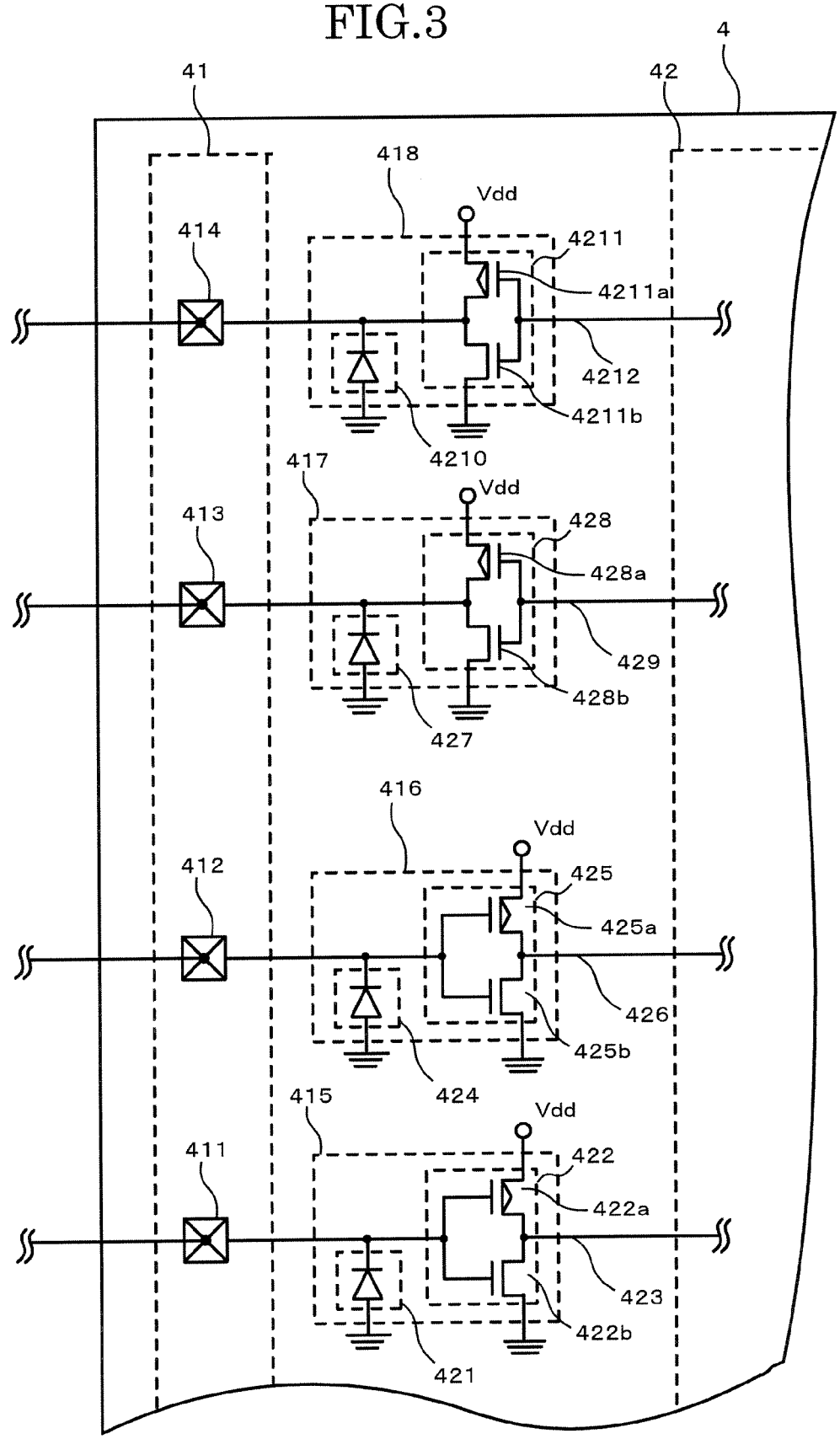
FIG. 3 is a schematic circuit view of a pad section and the vicinity thereof of the DDR semiconductor memory included in the multi-chip package according to one embodiment of the present invention.

FIG. 2 is a functional block diagram of the DDR semiconductor memory 4 according to this embodiment. As shown in FIG. 2, the semiconductor memory 4 according to this embodiment includes the pad section 41 connectable with the lines 5 provided on the substrate 2 (FIG. 1), a peripheral circuit 42 which is connected to the pad section 41, a column decoder 43, a row decoder 44 and a memory cell 45. The DDR semiconductor memory 4 according to this embodiment uses both a clock signal and an inverted clock signal having an opposite phase to the clock signal as control signals, such that data is transferable at twice the cycle of the clock signal, which is input from an external device. As shown in FIG. 3, the pad section 41 of the DDR semiconductor memory 4 includes a clock signal pad 411 to which a clock signal is input (also referred to as a "first pad"), an inverted clock signal pad 412 to which an inverted clock signal is input (also referred to as a "second pad"), a data enable signal pad 413 for outputting a data enable signal in synchronization with the clock signal or the inverted clock signal (also referred to as a "third pad"), and a data signal pad 414 for outputting a data signal in synchronization with the clock signal or the inverted clock signal (also referred to as a "fourth pad"). The DDR semiconductor memory 4 also includes, on a stage prior to the peripheral circuit 42, a first circuit 415 and a connection line 423. The first circuit 415 includes a protection circuit 421 and a buffer circuit 422 which are connected to the clock signal pad 411. The connection line 423 is connected to the buffer circuit 422 of the first circuit 415. The clock signal is input to the peripheral circuit 42 (an address counter, an output data control flip-flop, etc.) via the connection line 423. The protection circuit 421 includes a diode, and the buffer circuit 422 includes a PMOS transistor 422*a* and an NMOS transistor 422*b* which are connected to each other, although these circuits are not limited to having the structures shown in FIG. 3. Regarding the inverted clock signal pad 412, a similar circuit configuration as regarding the clock signal pad 411 is provided. Namely, the DDR semiconductor memory 4 includes, on a stage prior to the peripheral circuit 42, a second circuit 416 and a connection line 426. The second circuit 416 includes a protection circuit 424 and a buffer circuit 425 which are connected to the inverted clock signal pad 412. The connection line 426 is connected to the buffer circuit 425 of the second circuit 416. The inverted clock signal is input to the other circuits in the DDR semiconductor memory 4 via the connection line 426. Also regarding the data enable signal pad 413, a similar circuit configuration is provided. Namely, the DDR semiconductor memory 4 includes, on a stage prior to the peripheral circuit 42, a third circuit 417 and a connection line 429. The third circuit 417 includes a protection circuit 427 and a buffer circuit 428 which are connected to the data enable signal pad 413. The connection line 429 is connected to the buffer circuit 428 of the third circuit 417. Via the connection line 429, a data enable signal in synchronization with the clock signal or the inverted clock signal is output. It should be noted that the buffer circuit 428 is provided in the opposite orientation to the buffer circuit 422 of the first circuit 415. Also regarding the data signal pad 414, a similar circuit configuration is provided. Namely, the DDR semiconductor memory 4 includes, on a stage prior to the peripheral circuit 42, a fourth circuit 418 and a connection line 4212. The fourth circuit 418 includes a protection circuit 4210 and a buffer circuit 4211 which are connected to the data signal pad 414. The connection line 4212 is connected to the buffer circuit 4211 of the fourth circuit 418. Via the connection line 4212, a data signal in synchronization with the clock signal or the inverted clock signal is output. It should be noted that the buffer circuit 4211 is provided in the opposite orientation to the buffer circuit 422 of the first circuit 415. As in the case regarding the clock signal pad 411, the protection circuits 424, 427 and 4210 each include a diode. The buffer circuit 425 includes a PMOS transistor 425*a* and an NMOS transistor 425*b* connected to each other. The buffer circuit 428 includes a PMOS transistor 428*a* and an NMOS transistor 428*b* connected to each other. The buffer circuit 4211 includes a PMOS transistor 4211*a* and an NMOS transistor 4211*b* connected to each other. The first circuit 415 connected to the clock signal pad 411 and the second circuit 416 connected to the inverted clock signal pad 412 have the same structure, and the third circuit 417 connected to the data enable signal pad 413 and the fourth circuit 418 connected to the data signal pad 414 have the same structure. Herein, the expression "the same structure" encompasses exactly the same structure, substantially the same structure with a design error or the like, and structures having the same function. The first circuit 415, the second circuit 416, the third circuit 417 and the fourth circuit 418 each preferably include a protection circuit and a buffer circuit in this embodiment as described above, but may be provided with various other embodiments with no specific limitation.

Figure 4:
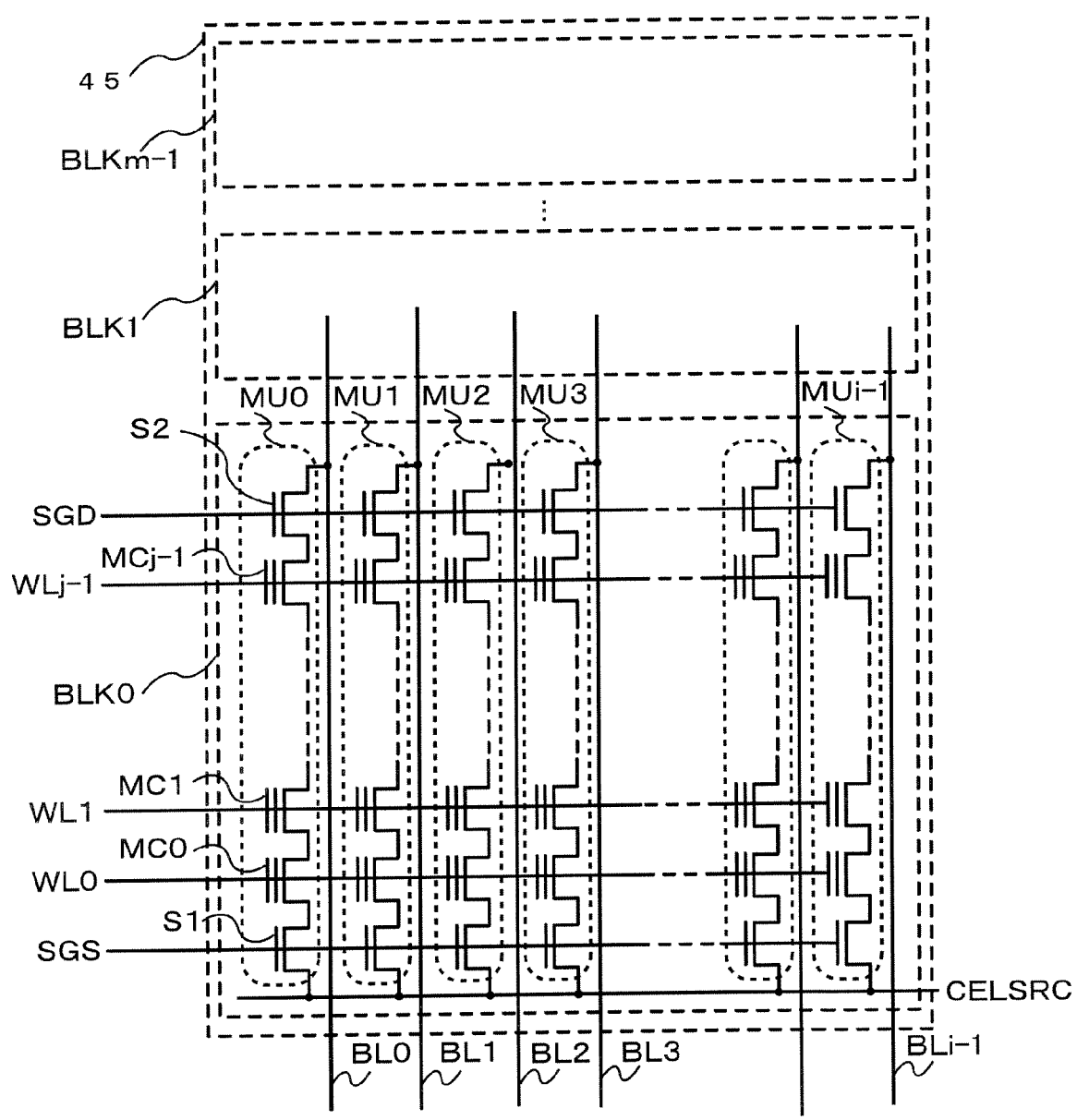
FIG. 4 is a schematic diagram of a cell array of the DDR semiconductor memory included in the multi-chip package according to one embodiment of the present invention.
Figure 5:
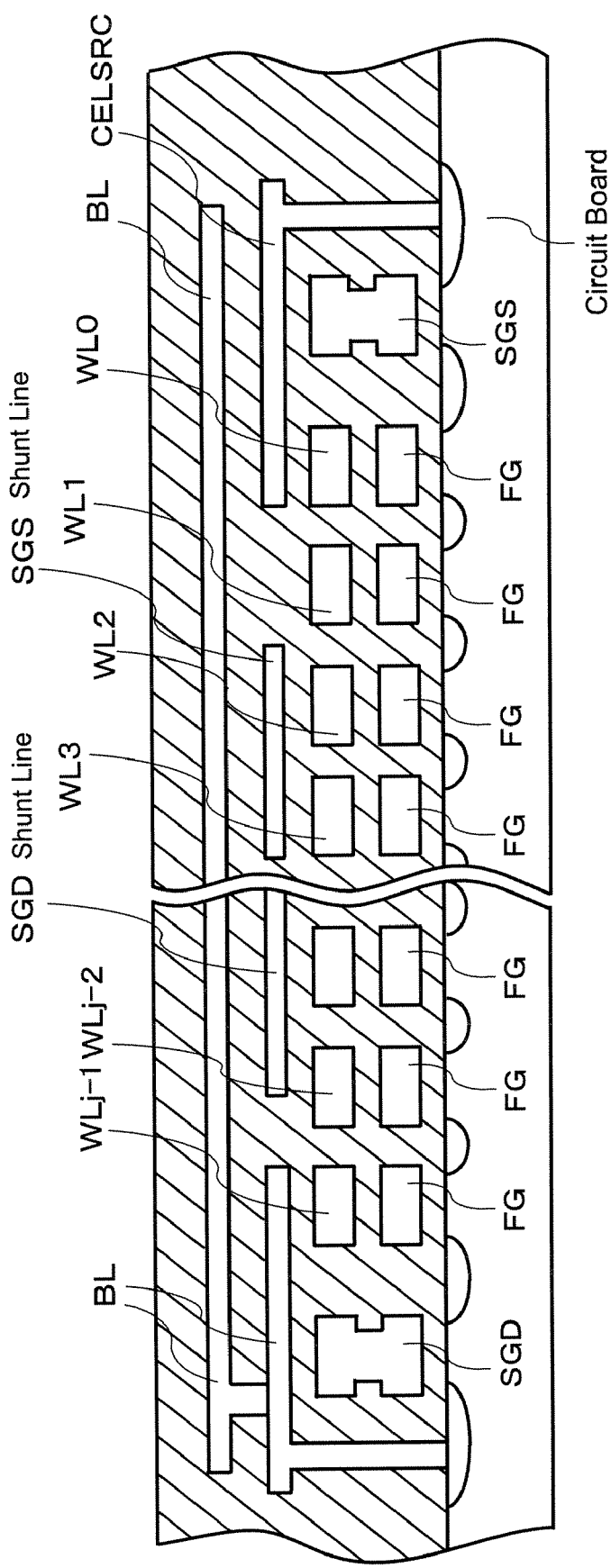
FIG. 5 is a schematic cross-sectional view of the cell array of the DDR semiconductor memory included in the multi-chip package according to one embodiment of the present invention.

The DDR semiconductor memory 4 according to this embodiment may be of a NAND type or a NOR type, and may be volatile or nonvolatile, with no specific limitation. FIG. 4 shows a NAND type nonvolatile memory cell array 45 as an example of the DDR semiconductor memory 4. As shown in FIG. 4, the NAND type nonvolatile memory cell array 45 includes a plurality of memory cell blocks BLK0 through BLKm-1. Each memory cell block includes a plurality of memory cell units MU0 through MUi-1, a plurality of word lines WL0 through WLj-1 commonly provided in the plurality of memory cell units MU0 through MUi-1, a source-side selection gate line SGS, a drain-side selection gate line SGD, and a plurality of bit lines BL0 through BLi-1 respectively connected to the plurality of memory cell units MU0 through MUi-1. In each memory cell unit, a drain-side area of a drain-side selection transistor S2 is connected to the corresponding bit line, and a source-side area of a source-side selection transistor S1 is connected to a common cell line CELSRC. FIG. 5 is a cross-sectional view of the memory cell array 45. As shown in FIG. 5, the memory cell array 45 includes a substrate, floating gates (FG) provided on the substrate with an insulating layer interposed therebetween, the source-side selection gate line SGS, the drain-side selection gate line SGD, the plurality of word lines WL0 through WLj-1 respectively facing the floating gates (FG) with an insulating layer interposed therebetween, and the bit lines (BL), an SGD shunt line, an SGS shunt line and the cell line CELSRC which are provided on the above-mentioned elements with an insulating layer interposed therebetween. With such a structure, the DDR semiconductor memory 4 according to this embodiment can store various types of data.

Figure 6:
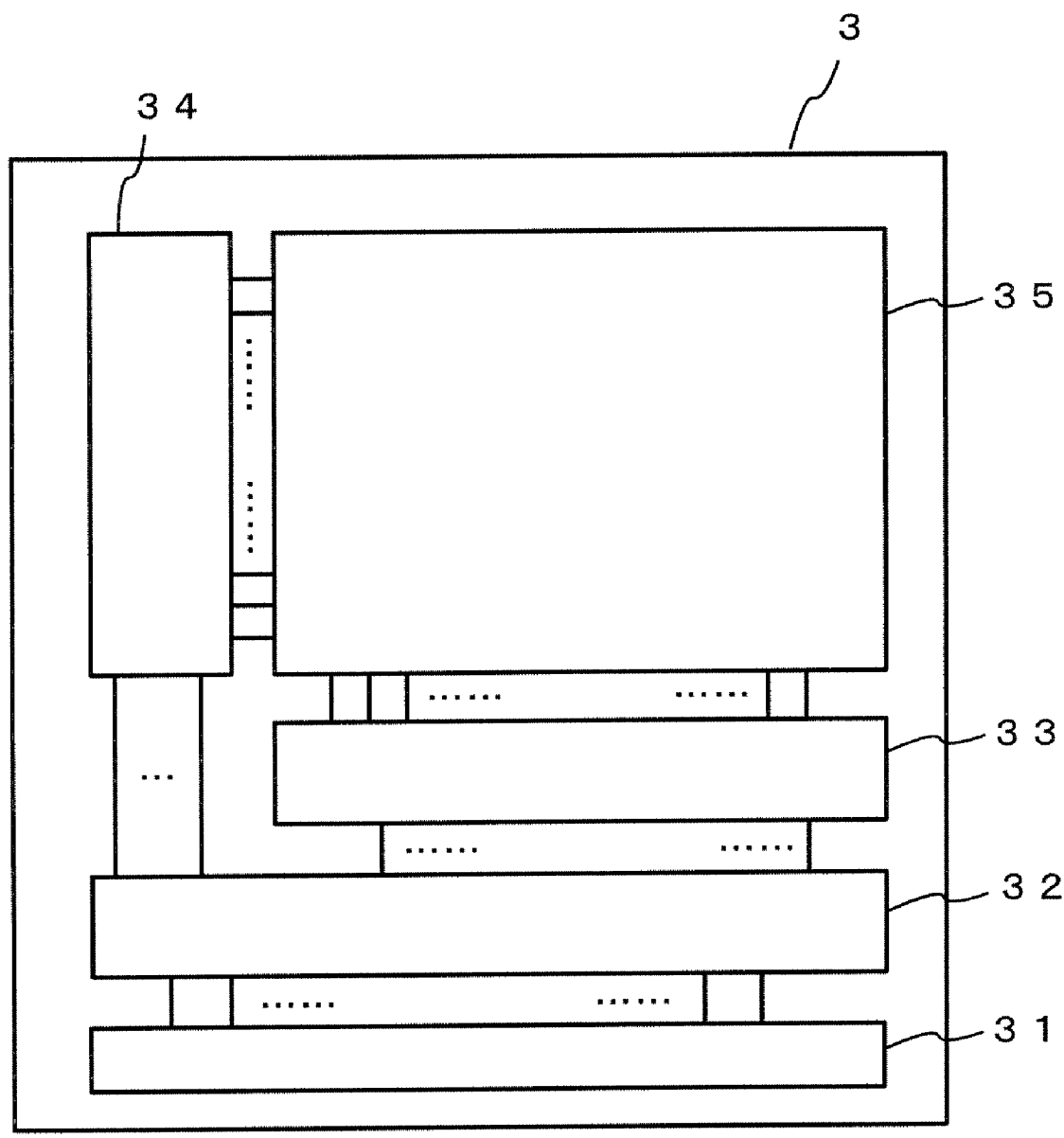
FIG. 6 is a functional block diagram of an SDR semiconductor memory included in the multi-chip package according to one embodiment of the present invention.

FIG. 6 is a functional block diagram of the SDR semiconductor memory 3 according to this embodiment. As shown in FIG. 6, the SDR semiconductor memory 3 has substantially the same structure as that of the DDR semiconductor memory 4. More specifically, the SDR semiconductor memory 3 includes the pad section 31 connectable with the lines 5 provided on the substrate 2 of the MCP 1 (FIG. 1), a peripheral circuit 32 which are connected to the pad section 31, a column decoder 33 and a row decoder 34 and a memory cell 45. Like the DDR semiconductor memory 4, the SDR semiconductor memory 3 may be of a NAND type or a NOR type, and may be volatile or non-volatile.

The SDR semiconductor memory 3 uses an external clock signal as a control signal like the DDR semiconductor memory 4, but does not need to use an inverted clock signal as a control signal unlike the DDR semiconductor memory 4. Due to this difference, when the SDR semiconductor memory 3 is packaged together with the DDR semiconductor memory 4, a problem of signal delay is newly caused as described below. In this specification, an expression "semiconductor memory using a clock signal as a control signal" refers to a semiconductor memory which does not use an inverted clock signal as a control signal. For example, an SDR semiconductor memory is a "semiconductor memory using a clock signal as a control signal".

Figure 7:
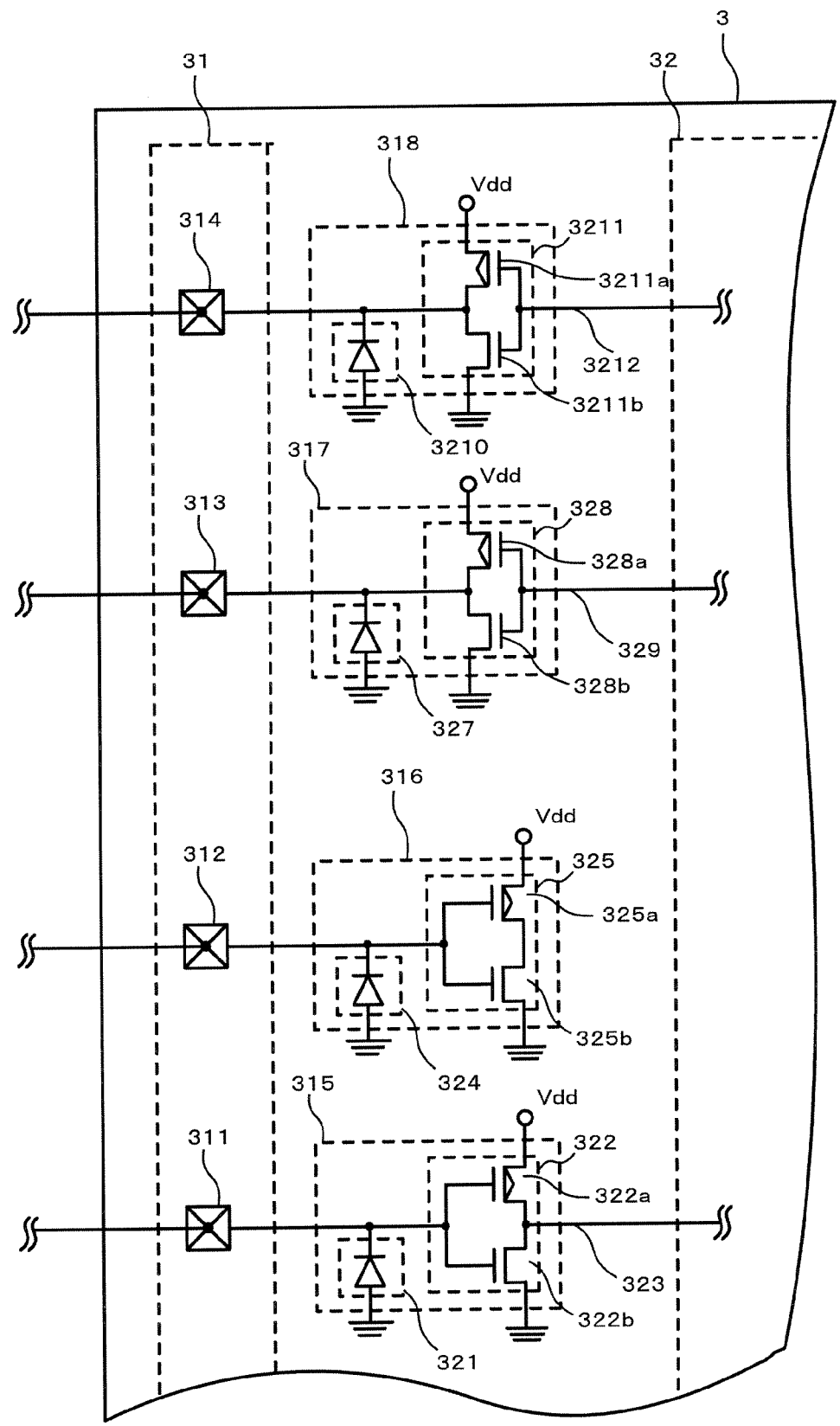
FIG. 7 is a schematic circuit view of a pad section and the vicinity thereof of the SDR semiconductor memory included in the multi-chip package according to one embodiment of the present invention.
Figure 8:
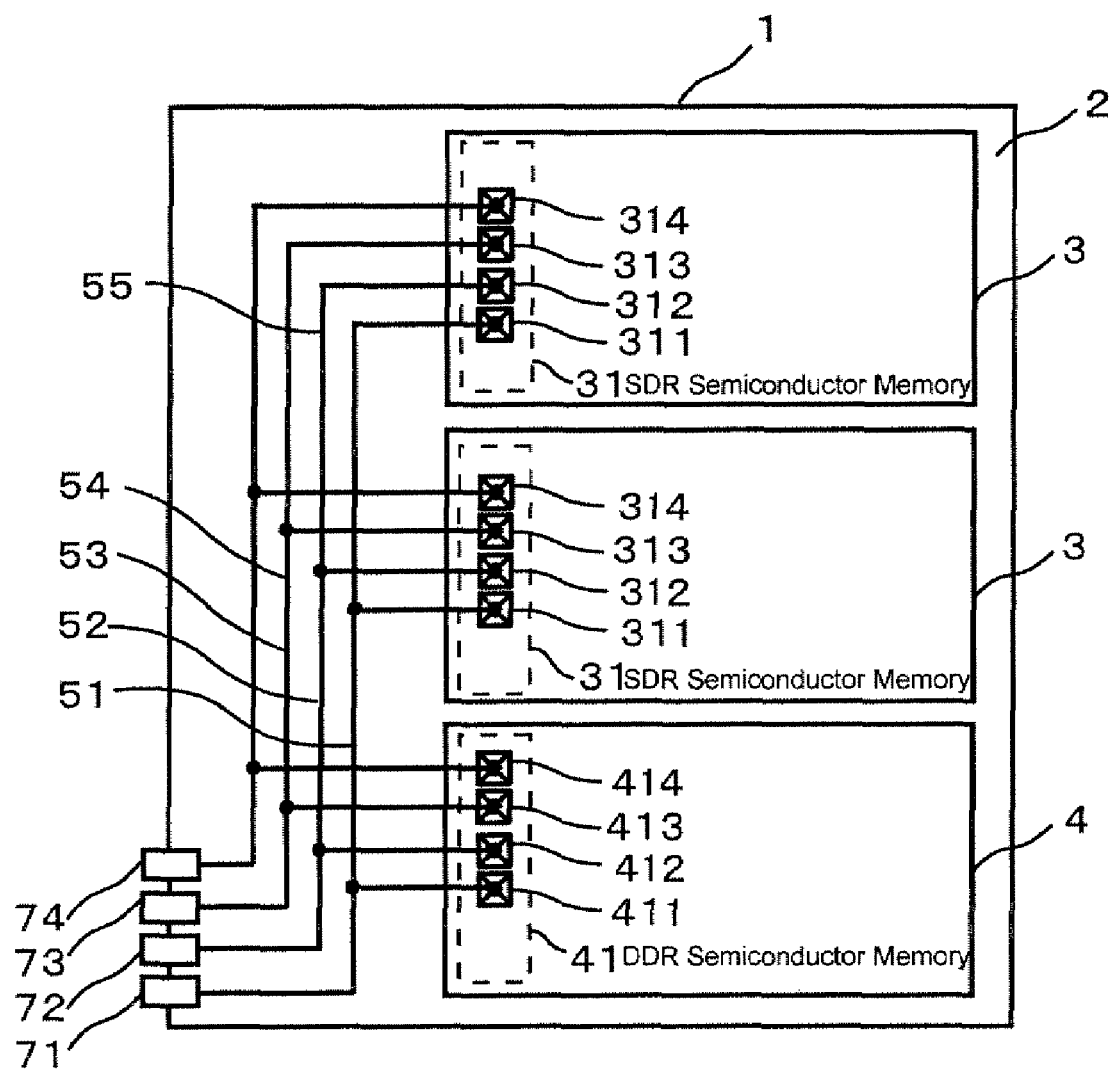
FIG. 8 is a schematic block diagram of lines of the multi-chip package according to one embodiment of the present invention.

As described above, the SDR semiconductor memory 3 does not need to use an inverted clock signal as a control signal, unlike the DDR semiconductor memory 4. Therefore, the SDR semiconductor memory 3 does not need to include an inverted clock signal pad, or a protection circuit or a buffer circuit connected to the inverted clock signal pad, unlike the DDR semiconductor memory 4. In the SDR semiconductor memory 3, these circuits or a line for connecting these circuits to the pad are not necessary and are not provided on the substrate 2 of the MCP 1. The SDR semiconductor memory 3 is different from the DDR semiconductor memory 4 in the electric environments of the pad section, the peripheral circuit and the lines on the substrate 2. Such a difference in the electric environments causes a difference in the parasitic capacitance generated mainly between the lines and between the circuits. This influences the Duty Ratio (the ratio of the "High" period and the "Low" period) of the clock signal and the inverted clock signal. The parasitic capacitance difference may be as large as about 4 pF in some designs, and may cause a problem that the Duty within a desired standard range is not guaranteed especially when the memory is operated at a high speed (100 MHz to 300 MHz or higher) which is required recently. The SDR semiconductor memory 3 of the MCP 1 according to this embodiment includes a circuit for adjusting the parasitic capacitance (parasitic capacitance adjusting circuit) and a line for adjusting the parasitic capacitance (parasitic capacitance adjusting line) provided on the substrate 2, as follows. As the parasitic capacitance adjusting circuit, the SDR semiconductor memory according to this embodiment 3 includes an inverted clock signal pad 312 (FIG. 7) and a sixth circuit 316. The sixth circuit 316 includes a protection circuit 324 and a buffer circuit 325 which are connected to the inverted clock signal pad 312. The parasitic capacitance adjusting circuit has a similar structure to that of a clock signal pad 311 and a fifth circuit 315, which includes a protection circuit 321 and a buffer circuit 322 which are connected to the clock signal pad 311. As the parasitic capacitance adjusting line, the SDR semiconductor memory 3 include a line for connecting the sixth circuit 316 to the inverted clock signal pad 312. FIG. 7 is an equivalent circuit diagram of a part of the SDR semiconductor memory 3 according to this embodiment, and FIG. 8 is a schematic block diagram of connection lines of the MCP 1.

As shown in FIG. 7, the pad section 31 of the SDR semiconductor memory 3 according to this embodiment includes the clock signal pad 311 to which a clock signal is input (also referred to as a "fifth pad"), a data enable signal pad 313 for outputting a data enable signal in synchronization with the clock signal (also referred to as a "seventh pad"), and a data signal pad 314 for outputting a data signal in synchronization with the clock signal (also referred to as an "eighth pad"). The SDR semiconductor memory 3 also includes, on a stage prior to the peripheral circuit 32, the fifth circuit 315 including the protection circuit 312 and the buffer circuit 322 which are connected to the clock signal pad 311, a seventh circuit including a protection circuit 327 and a buffer circuit 328 which are connected to the data enable signal pad 313, and an eighth circuit 318 including a protection circuit 3210 and a buffer circuit 3211 which are connected to the data signal pad 314. The buffer circuit 328 of the seventh circuit 317 and the buffer circuit 3211 of the eighth circuit 318 are provided in the opposite orientation to the buffer circuit 322 of the fifth circuit 315. The SDR semiconductor memory 3 further includes connection lines 323, 329 and 3212 respectively for connecting the buffer circuit 322 of the first circuit 315, the buffer circuit 328 of the seventh circuit 317, and the buffer circuit 3212 of the eighth circuit 318 to the peripheral circuit 32. As described above, the SDR semiconductor memory 3 also includes the inverted clock signal pad 312 (also referred to as a "sixth pad") provided in the pad section 31 and the sixth circuit 316, which includes the protection circuit 324 and the buffer circuit 325 which are connected to the inverted clock signal pad 312. As described above, the inverted clock signal pad 312 and the sixth circuit 316 have a similar structure to that of the clock signal pad 311 and the fifth circuit 315. However, there is no line for electrically connecting the sixth circuit 316 to the peripheral circuit 32, and thus the sixth circuit 316 is insulated from the peripheral circuit 32. In the SDR semiconductor memory 3 according to this embodiment, the clock signal pad 311 and the inverted clock signal 312 have the same structure, and the protection circuit 321 and the buffer circuit 322 connected to the clock signal pad 311 (i.e., the fifth circuit 315) and the protection circuit 324 and the buffer circuit 325 connected to the clock signal pad 312 (the sixth circuit 316) have substantially the same structure. Therefore, there is substantially no parasitic capacitance difference between the clock signal-side circuit and the inverted clock signal-side circuit. As a result, the signal delay does not occur in the SDR semiconductor memory 3. Like the third circuit 417 and the fourth circuit 418, the seventh circuit 317 and the eighth circuit 318 have the same structure as each other. None of the inverted clock signal pad 312, the protection circuit 324 and the buffer circuit 325 is directly involved in the storing operation of the SDR semiconductor memory 3. These circuits are connected to the inverted clock signal pad 312 but preferably are not connected to any other peripheral circuit in the SDR semiconductor memory 3 (i.e., are preferably insulated from the other circuits in the SDR semiconductor memory 3). In this sense, the inverted clock signal pad 312 may be called a dummy pad, and the protection circuit 324 and the buffer circuit 325 connected to the inverted clock signal pad 312 may be called a dummy protection circuit and a dummy buffer circuit.

In this embodiment, the sixth circuit 316 of the SDR semiconductor memory 3 is structured the same as, and is provided at the same location as, the fifth circuit 315 on the clock signal side and the second circuit 416 on the inverted clock signal side of the DDR semiconductor memory 4. However, there is no specific limitation in the structure or the location of the circuits as long as the parasitic capacitance of the clock signal-side circuit is equivalent to that of the inverted clock signal-side circuit. It is, however, preferable to form the fifth circuit 315 and the sixth circuit 316 with the same structure than to detect a parasitic capacitance generated in the fifth circuit 315 on the clock signal side and then form the sixth circuit 316 such that the clock signal-side circuit and the inverted clock signal-side circuit substantially do not have a parasitic capacitance difference. The reason is that in the former case, the signal delay can be suppressed without reviewing the parasitic capacitance difference in detail.

As described above, the signal delay can be suppressed by providing an inverted clock signal pad and circuits connected thereto as dummy elements in the SDR semiconductor memory 3. However, signal delay also occurs in the lines provided on the substrate of the MCP 1 as well as in the semiconductor memories. The parasitic capacitance difference caused by each semiconductor memory is generally about 3 pF, whereas the parasitic capacitance difference caused by the lines of the MCP 1 is about 30% thereof, i.e., about 1 pF. As shown in FIG. 8, the MCP 1 according to this embodiment includes, on the substrate 2, a clock signal line 51 for transferring an external clock signal to the DDR semiconductor memory 4 and the SDR semiconductor memories 3, an inverted clock signal line 52 for transferring an external inverted clock signal to the DDR semiconductor memory 4, a data enable signal line 53 for transferring a data enable signal to an external device, and a data signal line 54 for transferring a data signal to an external device. The MCP 1 also includes an inverted clock signal line 55 for connecting the inverted clock signal line 52 to the inverted clock signal pads 312 of the SDR semiconductor memories 3. Owing to this structure, the MCP 1 can suppress the parasitic capacitance difference in each semiconductor memory and also the parasitic capacitance difference between the semiconductor memories included in the MCP 1. This improves the reliability of the MCP 1.

Namely, the MCP 1 includes the inverted clock signal line 55 provided on the substrate 2 as a parasitic capacitance adjusting line, and also includes the inverted clock signal pad 312 and the sixth circuit 316 connected thereto provided in each SDR semiconductor memory 3 as a parasitic capacitance adjusting circuit. Owing to such a structure, the MCP 1 suppresses the parasitic capacitance difference between the clock signal line and the inverted clock signal line, i.e., the signal delay. More specifically, in order to suppress the parasitic capacitance difference and the influence of the signal delay, it is preferable that a sum of the parasitic capacitance of the clock signal line 51 from a terminal 71 to the first pad 411 and the parasitic capacitance of the clock signal line 51 from the terminal 71 to the fifth pad 311, is equal to a sum of the parasitic capacitance of the inverted clock signal line 52 from a terminal 72 to the second pad 412 and the parasitic capacitance of the inverted clock signal lines 52 and 55 from the terminal 72 to the sixth pad 312. In this case, it is also preferable that a sum of the parasitic capacitance of the data enable signal line 53 from a terminal 73 to the third pad 413 and the parasitic capacitance of the data enable signal line 53 from the terminal 73 to the seventh pad 313, is equal to a sum of the parasitic capacitance of the data signal line 54 from a terminal 74 to the fourth pad 414 and the parasitic capacitance of the data signal line 54 from the terminal 74 to the eighth pad 314. The parasitic capacitance may be equalized in many ways, but it is preferable to equalize at least one of the elements of the lines which influence the parasitic capacitance, for example, length, width or material of the lines.

As described above, the present invention provides a multi-chip package guaranteeing that a signal delay is suppressed and also provides semiconductor memory devices usable for such a multi-chip package.

What is claimed is:

1. A multi-chip package comprising:
   a substrate;
   a first terminal to which a clock signal is input;
   a second terminal to which an inverted clock signal is input;
   a third terminal for outputting a data enable signal in synchronization with the clock signal or the inverted clock signal;
   a fourth terminal for outputting a data signal in synchronization with the clock signal or the inverted clock signal;
   a first semiconductor memory, provided on the substrate, which is controlled by the clock signal and the inverted clock signal, including:
      a first pad to which the clock signal is input,
      a second pad to which the inverted clock signal is input,
      a third pad for outputting the data enable signal,
      a fourth pad for outputting the data signal,
      a first peripheral circuit,
      a first circuit provided between the first pad and the first peripheral circuit,
      a second circuit provided between the second pad and the first peripheral circuit,
      a third circuit provided between the third pad and the first peripheral circuit, and
      a fourth circuit provided between the fourth pad and the first peripheral circuit; and
   a second semiconductor memory, provided on the substrate, which is controlled by the clock signal, including:
      a fifth pad to which the clock signal is input,
      a sixth pad to which the inverted clock signal is input,
      a seventh pad for outputting the data enable signal,
      an eighth pad for outputting the data signal,
      a second peripheral circuit,
      a fifth circuit provided between the fifth pad and the second peripheral circuit,
      a sixth circuit provided between the sixth pad and the second peripheral circuit,
      a seventh circuit provided between the seventh pad and the second peripheral circuit, and
      an eighth circuit provided between the eighth pad and the second peripheral circuit.

2. The multi-chip package according to claim 1, wherein the second circuit has the same structure as that of the first circuit, the fourth circuit has the same structure as that of the third circuit, the sixth circuit has the same structure as that of the fifth circuit, and the eighth circuit has the same structure as that of the seventh circuit.

3. The multi-chip package according to claim 1, wherein the second circuit has an equal parasitic capacitance to that of the first circuit, the fourth circuit has an equal parasitic capacitance to that of the third circuit, the sixth circuit has an equal parasitic capacitance to that of the fifth circuit, and the eighth circuit has an equal parasitic capacitance to that of the seventh circuit.

4. The multi-chip package according to claim 1, wherein the first circuit is connected to the first pad and the first peripheral circuit, the second circuit is connected to the second pad and the first peripheral circuit, the third circuit is connected to the third pad and the first peripheral circuit, the fourth circuit is connected to the fourth pad and the first peripheral circuit, the fifth circuit is connected to the fifth pad and the second peripheral circuit, the sixth circuit is connected to the sixth pad, the sixth circuit is not connected to the second peripheral circuit, the seventh circuit is connected to the seventh pad and the second peripheral circuit, and the eighth circuit is connected to the eighth pad and the second peripheral circuit.

5. The multi-chip package according to claim 1, wherein the first semiconductor memory is DDR semiconductor memory and the second semiconductor memory is SDR semiconductor memory.

6. The multi-chip package according to claim 1, further comprising a CPU which control the first semiconductor memory and the second semiconductor memory.

7. The multi-chip package according to claim 1, wherein the first semiconductor memory and the second semiconductor memory are volatile semiconductor memories.

8. The multi-chip package according to claim 1, wherein the first semiconductor memory and the second semiconductor memory are nonvolatile semiconductor memories.

9. The multi-chip package according to claim 1, wherein the first semiconductor memory and the second semiconductor memory are NAND type nonvolatile semiconductor memories.

10. The multi-chip package according to claim 2, wherein the second circuit has an equal parasitic capacitance to that of the first circuit, the fourth circuit has an equal parasitic capacitance to that of the third circuit, the sixth circuit has an equal parasitic capacitance to that of the fifth circuit, and the eighth circuit has an equal parasitic capacitance to that of the seventh circuit.

11. The multi-chip package according to claim 2, wherein:
a sum of a parasitic capacitance of a line for electrically connecting the first terminal and the first pad and a parasitic capacitance of a line for electrically connecting the first terminal and the fifth pad, is equal to a sum of a parasitic capacitance of a line for electrically connecting the second terminal and the second pad and a parasitic capacitance of a line for electrically connecting the second terminal and the sixth pad; and
a sum of a parasitic capacitance of a line for electrically connecting the third terminal and the third pad and a parasitic capacitance of a line for electrically connecting the third terminal and the seventh pad, is equal to a sum of a parasitic capacitance of a line for electrically connecting the fourth terminal and the fourth pad and a parasitic capacitance of a line for electrically connecting the fourth terminal and the eighth pad.

12. The multi-chip package according to claim 2, wherein:
a sum of a length of a line for electrically connecting the first terminal and the first pad and a length of a line for electrically connecting the first terminal and the fifth pad, is equal to a sum of a length of a line for electrically connecting the second terminal and the second pad and a length of a line for electrically connecting the second terminal and the sixth pad; and
a sum of a length of a line for electrically connecting the third terminal and the third pad and a length of a line for electrically connecting the third terminal and the seventh pad, is equal to a sum of a length of a line for electrically connecting the fourth terminal and the fourth pad and a length of a line for electrically connecting the fourth terminal and the eighth pad.

13. The multi-chip package according to claim 2, wherein the first circuit is connected to the first pad and the first peripheral circuit, the second circuit is connected to the second pad and the first peripheral circuit, the third circuit is connected to the third pad and the first peripheral circuit, the fourth circuit is connected to the fourth pad and the first peripheral circuit, the fifth circuit is connected to the fifth pad and the second peripheral circuit, the sixth circuit is connected to the sixth pad, the sixth circuit is not connected to the second peripheral circuit, the seventh circuit is connected to the seventh pad and the second peripheral circuit, and the eighth circuit is connected to the eighth pad and the second peripheral circuit.

14. The multi-chip package according to claim 2, wherein the first semiconductor memory is DDR semiconductor memory and the second semiconductor memory is SDR semiconductor memory.

15. The multi-chip package according to claim 2, further comprising a CPU which control the first semiconductor memory and the second semiconductor memory.

16. The multi-chip package according to claim 3, wherein the first circuit is connected to the first pad and the first peripheral circuit, the second circuit is connected to the second pad and the first peripheral circuit, the third circuit is connected to the third pad and the first peripheral circuit, the fourth circuit is connected to the fourth pad and the first peripheral circuit, the fifth circuit is connected to the fifth pad and the second peripheral circuit, the sixth circuit is connected to the sixth pad, the sixth circuit is not connected to the second peripheral circuit, the seventh circuit is connected to the seventh pad and the second peripheral circuit, and the eighth circuit is connected to the eighth pad and the second peripheral circuit.

17. The multi-chip package according to claim 3, wherein the first semiconductor memory is DDR semiconductor memory and the second semiconductor memory is SDR semiconductor memory.

18. The multi-chip package according to claim 4, wherein the output side of the sixth circuit is insulated.

19. The multi-chip package according to claim 13, wherein the output side of the sixth circuit is insulated.

20. The multi-chip package according to claim 16, wherein the output side of the sixth circuit is insulated.

* * * * *